United States Patent
Chen et al.

(10) Patent No.: US 6,924,982 B2
(45) Date of Patent: Aug. 2, 2005

(54) HEAT DISSIPATION ASSEMBLY INCLUDING HEAT SINK AND FAN

(75) Inventors: Chun-Chi Chen, Tu-Chen (TW); Chin Hsien Lan, Tu-Chen (TW); Meng Fu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 5 days.

(21) Appl. No.: 10/756,734

(22) Filed: Jan. 12, 2004

(65) Prior Publication Data

US 2004/0145882 A1 Jul. 29, 2004

(30) Foreign Application Priority Data

Jan. 10, 2003 (TW) ...................................... 92200439 U

(51) Int. Cl.⁷ ................................................. H05K 7/20
(52) U.S. Cl. ...................... 361/697; 361/704; 257/718; 257/727; 174/16.3; 165/80.3; 165/185
(58) Field of Search ................................. 361/695, 697, 361/704, 719; 165/80.3, 185; 174/16.3; 257/718, 722, 727

(56) References Cited

U.S. PATENT DOCUMENTS

| | | | |
|---|---|---|---|
| 5,519,574 A | 5/1996 | Kodama et al. | |
| 5,590,025 A | 12/1996 | Clemens | |
| 6,407,919 B1 | 6/2002 | Chou | |
| 6,520,250 B2 | 2/2003 | Lee et al. | |
| 6,717,814 B2 * | 4/2004 | Li | 361/704 |
| 6,798,663 B1 * | 9/2004 | Rubenstein | 361/710 |
| 6,822,864 B2 * | 11/2004 | Huang et al. | 361/697 |
| 6,860,321 B2 * | 3/2005 | Ji-Hai et al. | 165/80.3 |
| 2002/0121358 A1 * | 9/2002 | Lee | 165/80.3 |

FOREIGN PATENT DOCUMENTS

| | | |
|---|---|---|
| TW | 478723 | 3/2002 |
| TW | 491501 | 6/2002 |
| TW | 493770 | 7/2002 |
| TW | 511883 | 11/2002 |

* cited by examiner

Primary Examiner—Boris Chérvinsky
(74) Attorney, Agent, or Firm—Wei Te Chung

(57) ABSTRACT

A heat dissipation assembly (100) includes a retention frame (90), a heat sink (80), a fan holder (10), a pair of clips (60) and a fan (20). The heat sink is mounted on the retention frame and forms a pair of shoulders (822) at opposite sides thereof. The fan holder includes a fan duct (40) surrounding a top portion of the heat sink and including a pair of supports mounted on the shoulders, and a holding frame (30) detachably mounted on the fan duct. The clips are mounted on the supports and engaged with the retention frame. One side of the holding frame is pivotally engaged with the fan duct, an opposite side of the holding frame forms a latching leg (33) that is engaged with an ear (412) formed at the fan duct. Three catching arms extend from the holding frame and retain the fan in the holding frame.

18 Claims, 5 Drawing Sheets

US 6,924,982 B2

HEAT DISSIPATION ASSEMBLY INCLUDING HEAT SINK AND FAN

BACKGROUND OF THE INVENTION

1. Field of the Invention

The present invention relates to a heat dissipation assembly having a heat sink and a fan, and more particularly to a heat dissipation assembly having a fan holder that comprises a first part mounted on the heat sink and a second part retaining the fan therein.

2. Description of Prior Art

Electronics technology continues to boom unabated. Numerous modem electronic devices such as central processing units (CPUs) of computers operate at high speed and thus generate large amounts of heat. The heat must be efficiently removed from the CPU; otherwise, abnormal operation or damage may result. Typically, a heat sink with good thermal conducting capability is mounted onto the CPU, and a fan is mounted onto the heat sink to enhance the heat dissipation capability thereof.

Most commonly, a fan is locked onto a heat sink by screws interferentially engaged with fins of the heat sink. Locking by this means is unduly laborious and slow. Additionally, the fins of the heat sink are generally thin and are liable to be deflected. Thus, the screws may loosen from the fins. The fan is liable to operate less efficiently, and may even become unserviceable.

To overcome the problems of the above-mentioned heat dissipation assembly, Taiwan Patent No. 511833 provides another kind of heat dissipation assembly. A fan is secured to a fan holder by screws. The combined fin and fan holder are then placed on a heat sink. A pair of clips is placed on the fan holder at opposite sides of the fan, and is engaged with a retention frame supporting the heat sink thereon. The fan and the heat sink are thus assembled together. However, screws are still needed. Locking the fan to the fan holder by this means is still laborious and slow. Furthermore, the combined fan and fan holder are placed on the heat sink without any adequate positioning element. The combination is liable to be displaced before the clips are engaged with the retention frame. This may lead to faulty engagement of the clips with the retention frame.

SUMMARY OF THE INVENTION

Accordingly, an object of the present invention is to provide a heat dissipation assembly including a heat sink and a fan, and which can be conveniently and safely assembled.

In order to achieve the object set out above, a heat dissipation assembly in accordance with a preferred embodiment of the present invention comprises a retention frame, a heat sink, a fan holder, a pair of clips and a fan. The heat sink is mounted on the retention frame and forms a pair of shoulders at opposite sides thereof. The fan holder includes a fan duct surrounding a top portion of the heat sink and including a pair of supports mounted on the shoulders, and a holding frame detachably mounted on the fan duct. The clips are mounted on the supports and engaged with the retention frame. One side of the holding frame is pivotally engaged with the fan duct, an opposite side of the holding frame forms a latching leg that is engaged with an ear formed at the fan duct. Three catching arms extend from the holding frame and retain the fan in the holding frame.

Other objects, advantages and novel features of the present invention will become more apparent from the following detailed description when taken in conjunction with the accompanying drawings, in which:

DETAILED DESCRIPTION OF THE INVENTION

Figure 1:
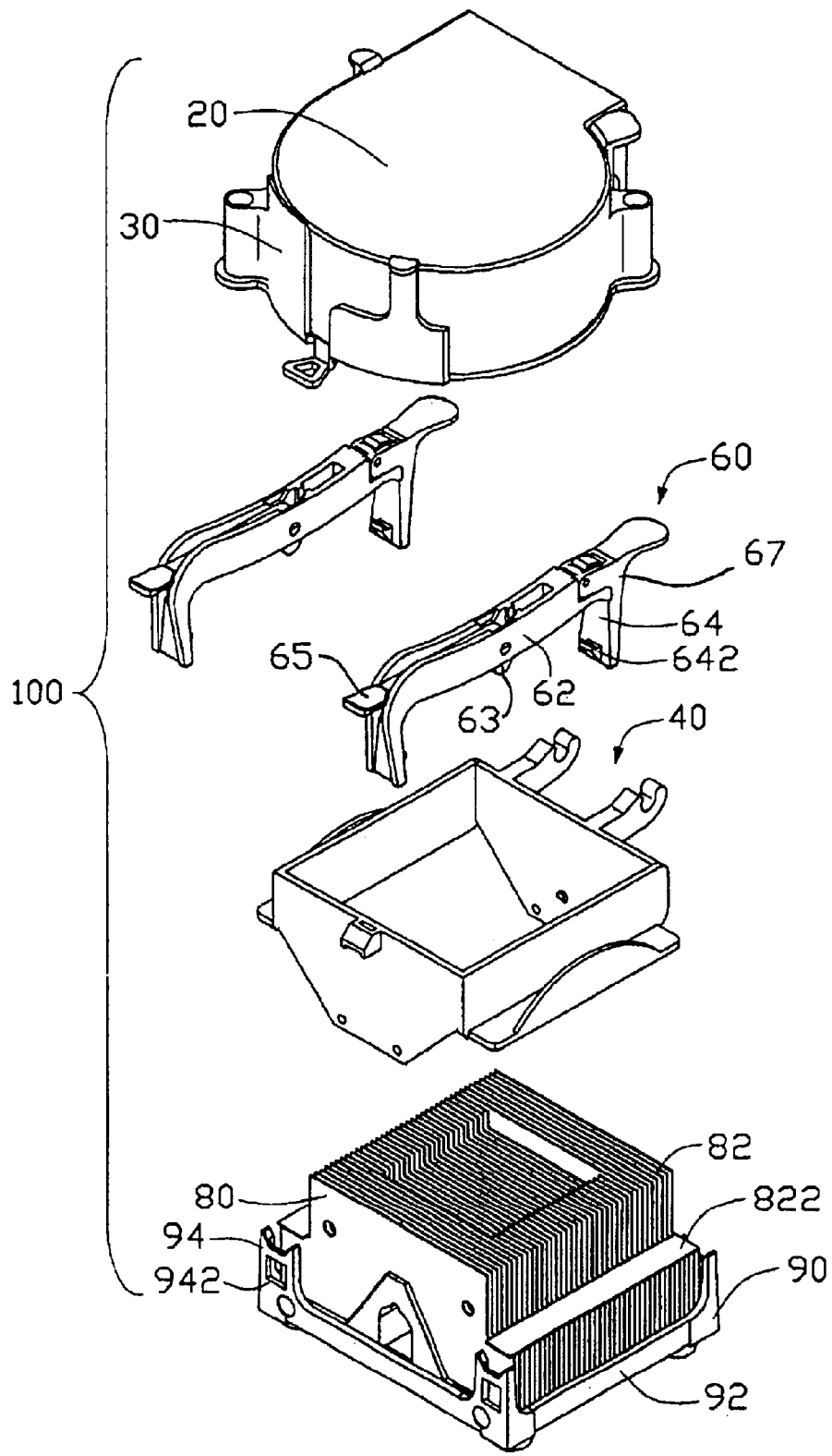
FIG. 1 is an exploded, isometric view of a heat dissipation assembly in accordance with the preferred embodiment of the present invention.

Referring to FIGS. 1–5, a heat dissipation assembly 100 in accordance with the preferred embodiment of the present invention comprises a fan holder 10, a fan 20, a pair of clips 60, a heat sink 80 and a retention frame 90. The fan holder 10 holds the fan 20, and is mounted on the heat sink 80. The retention frame 90 supports the heat sink 80 thereon. The clips 60 are mounted on the fan holder 10, and are engaged with the retention frame 90.

The heat sink 80 comprises a plurality of parallel fins 82. A pair of recessed shoulders 822 is formed at opposite sides of the fins 82 respectively. Each clip 60 is substantially "n" shaped, and comprises a horizontal beam 62 and a pair of clamping legs 64 extending from opposite ends of the beam 62 respectively. Each clamping leg 64 forms an inward hook 642 at a free end thereof. Structurally, each clip 60 includes an actuator arm 65 pivotally mounted to the beam 62 and having a cam 63 thereof around the pivot region to decide the tension and relaxation relation of the clip 60. Each clip 60 further includes the pivotal arm 67 pivotally mounted to the beam 62 and defining one of the aforementioned clamping legs 64. The retention frame 90 comprises a base portion 92, and four posts 94 extending upwardly from four corners of the base portion 92 respectively. Each post 94 defines an aperture 942 therein, for engagingly receiving a corresponding hook 642 of a corresponding clip 60.

Figure 2:
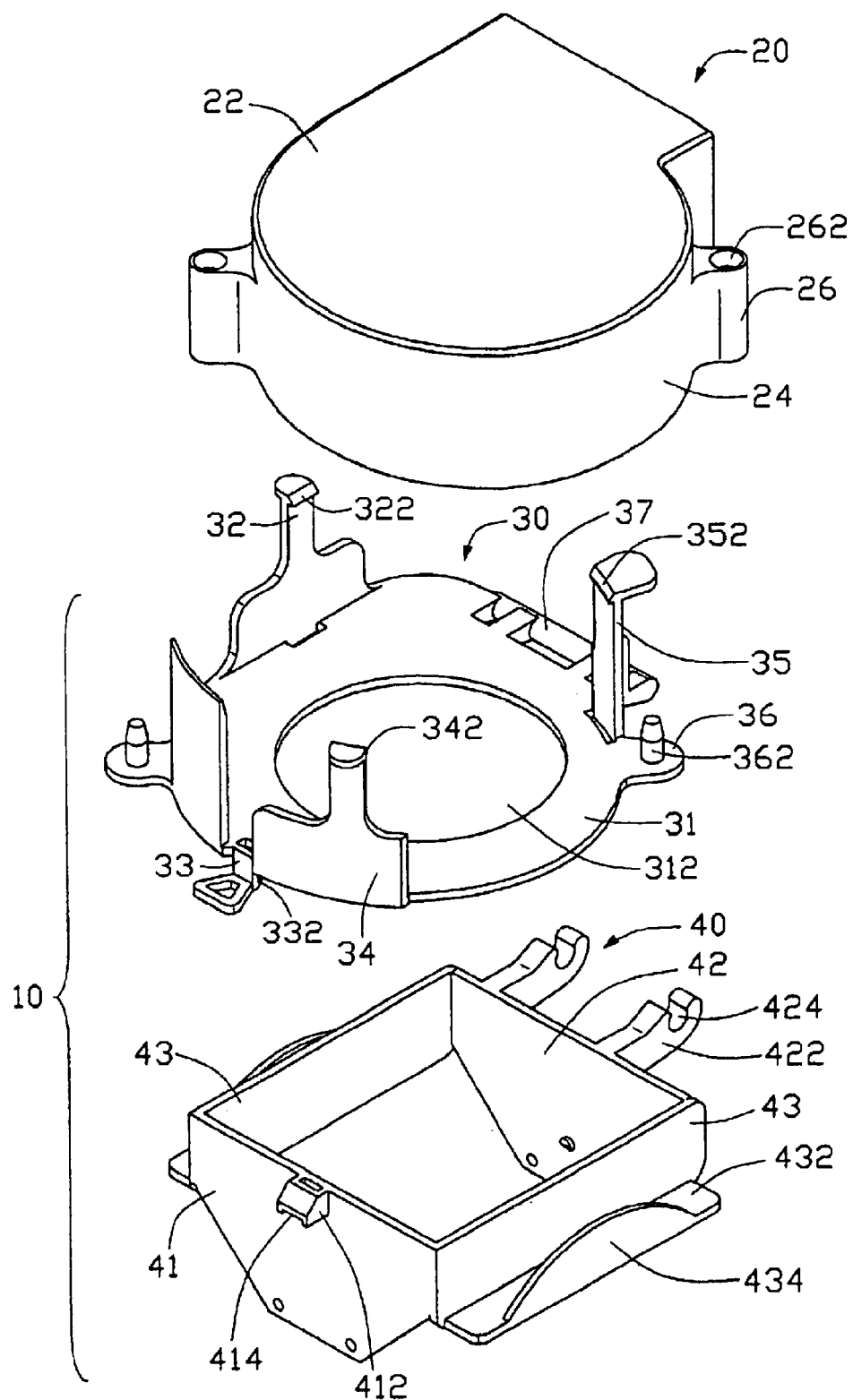
FIG. 2 is an exploded, isometric view of a fan and a fan holder of the heat dissipation assembly of FIG. 1.
Figure 3:
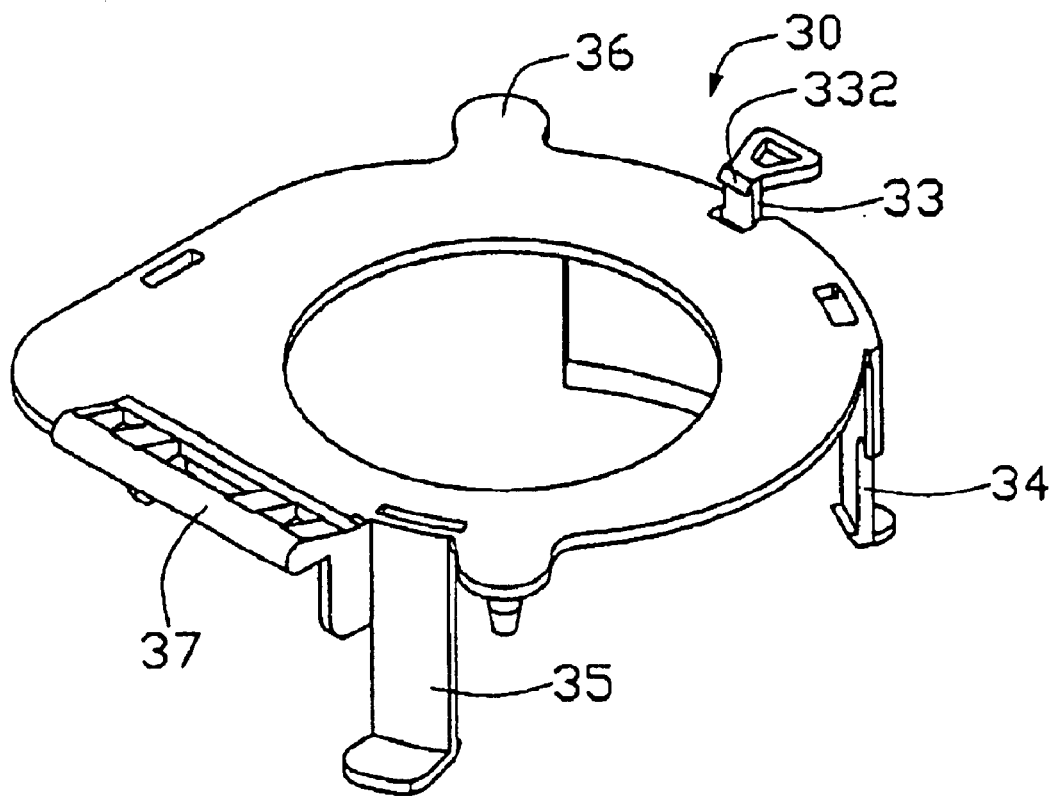
FIG. 3 is an isometric view of a holding frame of the fan holder of FIG. 2, but showing the holding frame inverted.
Figure 4:
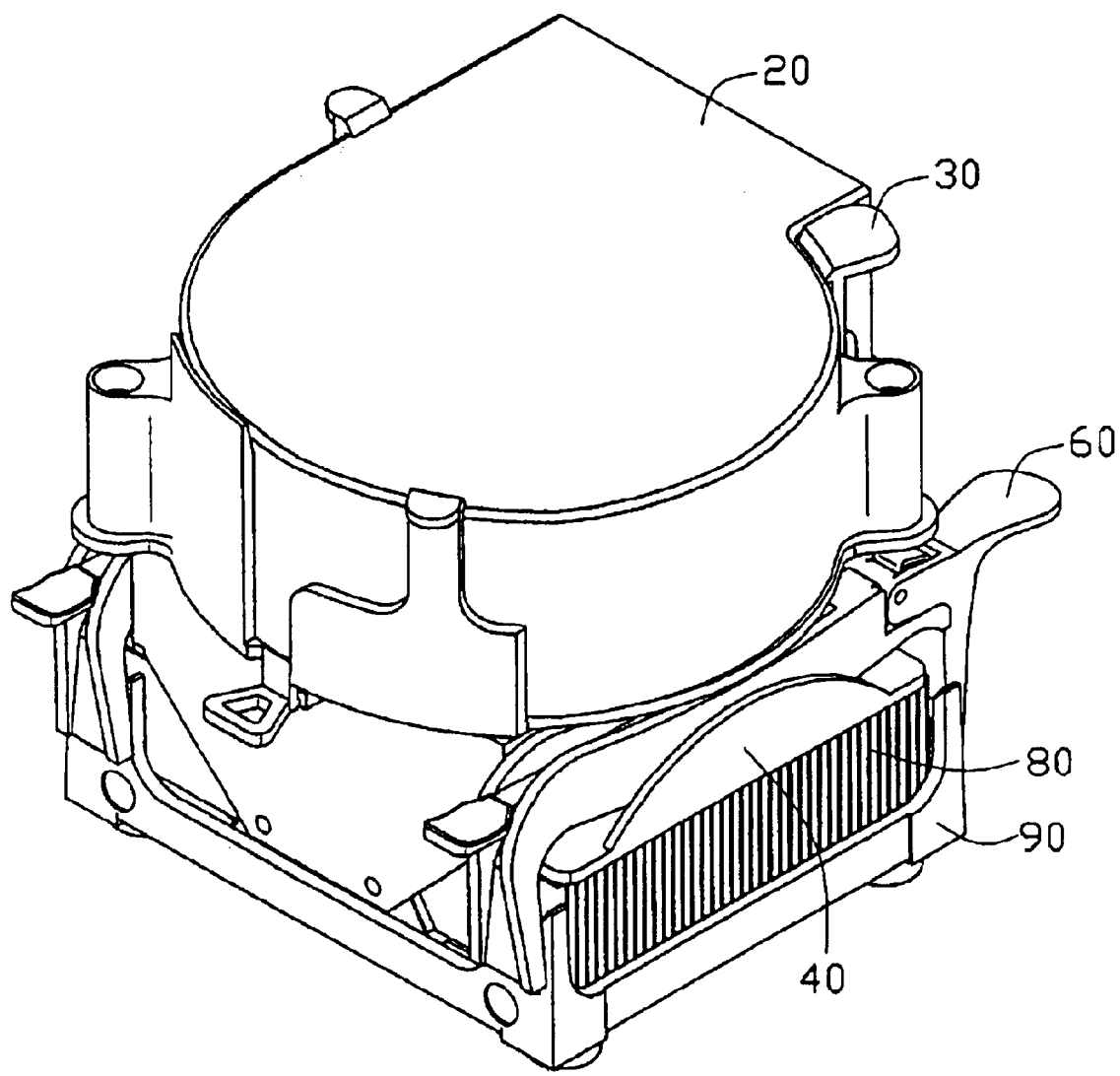
FIG. 4 is an assembled view of FIG. 1.
Figure 5:
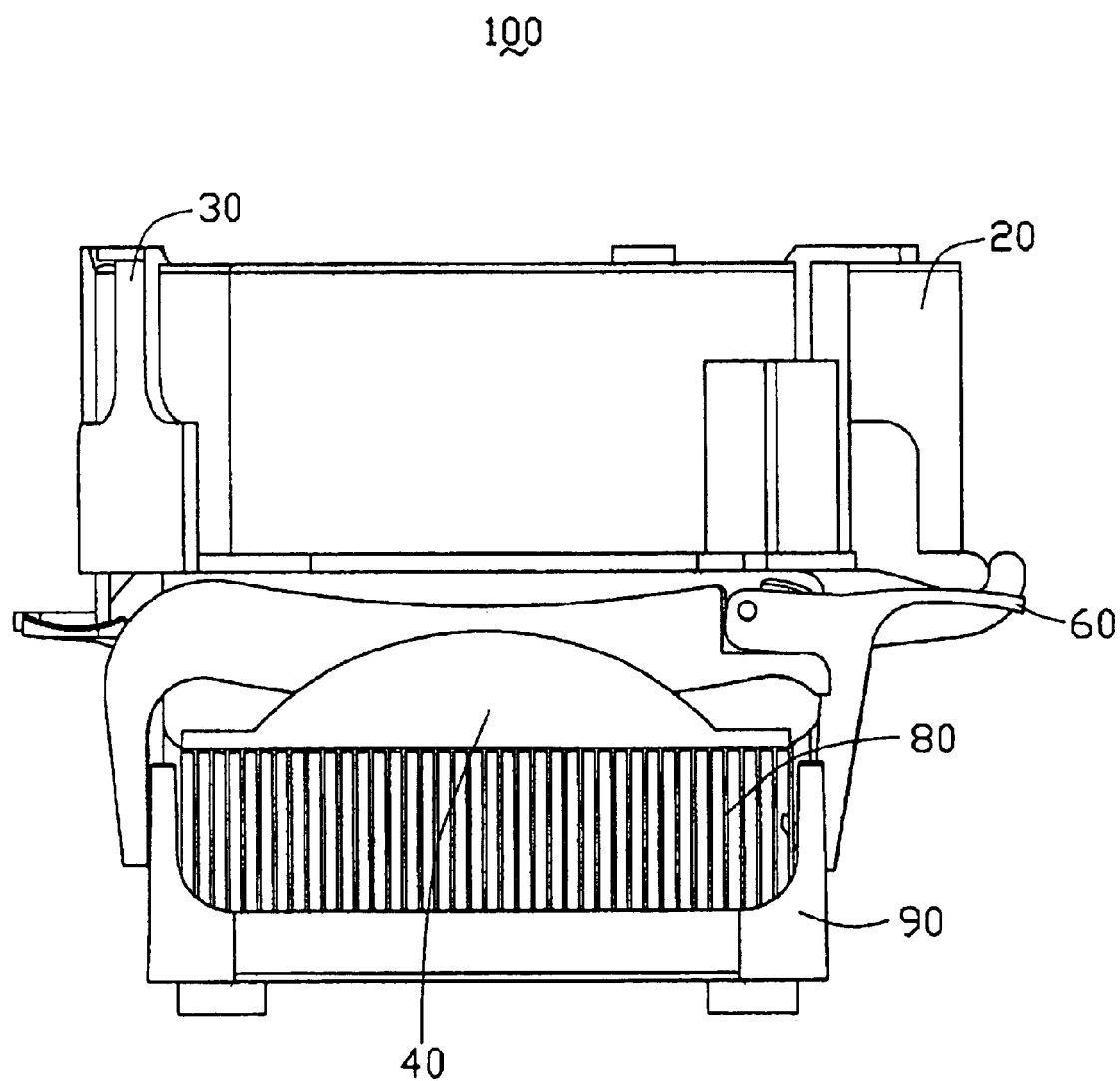
FIG. 5 is a side elevation of FIG. 4.

Referring to FIGS. 2–3, the fan 20 comprises a top wall 22, a peripheral wall 24 depending from a peripheral edge of the top wall 22, and a pair of vertical protrusions 26 protruding outwardly from opposite sides of the peripheral wall 24 respectively. Each protrusion 26 defines a vertical through hole 262 therein.

The fan holder 10 comprises a holding frame 30 and a fan duct 40. The holding frame 30 comprises a flat baseplate 31 defining an opening 312 in a middle thereof. Spaced first, second and third catching arms 32, 34, 35 extend upwardly from a peripheral edge of the baseplate 31. First, second and third catches 322, 342, 352 are formed inwardly from free ends of the catching arms 32, 34, 35, respectively. The catches 322, 342, 352 are for catching the top wall 22 of the fan 20, so that the arms 32, 34, 35 embrace the fan 20. A latching leg 33 extends downwardly from the peripheral edge of the baseplate 31 adjacent the second catching arm 34. A latch 332 is formed inwardly from a free end of the latching leg 33. A pair of locating tabs 36 extends coplanarly outwardly from opposite sides of the peripheral edge of the baseplate 31 respectively. A pin 362 extends upwardly from each locating tab 36, corresponding to a respective through hole 262 of the fan 20. A pivot lever 37 is formed on the peripheral edge of the baseplate 31, opposite from the latching leg 33.

The fan duct 40 comprises a first plate 41, an opposite second plate 42, and a pair of opposite third plates 43 interconnecting the first and second plates 41, 42. The plates 41, 42, 43 are for cooperatively surrounding and abutting a top portion of the heat sink 80. An outer ear 412 is formed at a topmost portion of the first plate 41. A slot 414 is defined in a bottom of the ear 412, for receiving the latch 332 of the holding frame 30. A pair of parallel hinges 422 extends perpendicularly outwardly from a top portion of the second plate 42. A pivot socket 424 is defined in a top of a distal end of each hinge 422. The pivot sockets 424 are for receiving the pivot lever 37 of the holding frame 30 therein. A supporting wing 432 extends perpendicularly outwardly from a bottom edge of each third plate 43. The wings 432 are mounted on the shoulders 822 of the heat sink 80, and are for supporting the beams 62 of the clips 60 thereon. A blocking flange 434 extends upwardly from an outmost edge of each wing 432, the blocking flange 434 being parallel to the corresponding third plate 43.

Referring to FIGS. 1–4, in assembly of the heat dissipation device 100, the heat sink 80 is placed into the retention frame 90 and surrounded by the posts 94. The fan duct 40 is placed on the heat sink 80, with the plates 41, 42, 43 of the fan duct 40 surrounding and abutting the top portion of the heat sink 80. The wings 432 of the fan duct 40 are supported on the shoulders 822 of the heat sink 80. The clips 60 are placed on the fan duct 40, with the beams 62 located on the wings 432 and blocked by the blocking flanges 434. The hooks 642 of the clamping legs 64 are engagingly received in the apertures 942 of the retention frame 90. At this stage, the combined fan duct 40 and heat sink 80 is firmly engaged with the retention frame 90.

The pivot lever 37 of the holding frame 30 is pivotably engaged in the pivot sockets 424 of the fan duct 40. The holding frame 30 is pivoted downwardly so that the latch 332 of the latching leg 33 is engagingly received in the slot 414 of the fan duct 40. The holding frame 30 is thus secured to the fan duct 40, with the opening 312 communicating with the fan duct 40. The fan 20 is depressed toward the baseplate 31 of the holding frame 30, with the through holes 262 in alignment with the pins 362 of the holding frame 30 respectively. The fan 20 slides over the catches 322, 342, 352. Finally, the through holes 262 receive the pins 362 therein, and the catches 322, 342, 352 snappingly catch the top wall 22 of the fan 20. The fan 20 abuts the baseplate 31, and is fittingly embraced by the catching arms 32, 34, 35 of the holding frame 30. The opening 312 of the holding frame 30 communicates with the fan 30.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation assembly comprising:
    a retention frame;
    a heat sink mounted on the retention frame, the heat sink defining a pair of shoulders at opposite sides thereof;
    a fan holder comprising a fan duct surrounding a top portion of the heat sink and a holding frame detachably mounted on the fan duct, a pair of supports extending from opposite sides of the fan duct, the supports being supported on the shoulders;
    a pair of clips mounted on the supports and engaged with the retention frame; and
    a fan held in the holding frame.

2. The assembly of claim 1, wherein a pivot lever is formed at a baseplate of the holding frame, a pair of hinges extends outwardly from the fan duct between the supports, each of the hinges defines a pivot socket therein, and the pivot lever of the holding frame is pivotally engaged in the pivot sockets.

3. The assembly of claim 2, wherein a latching leg depends from said baseplate of the holding frame, an ear is formed at the fan duct between the supports and opposite from the hinges, the latching leg being engaged with the ear.

4. The assembly of claim 3, wherein the latching leg forms a latch, the ear defines a slot, and the latch of the latching leg is engagingly received in the slot of the ear.

5. The assembly of claim 1, wherein two catching arms extend upwardly from a baseplate of the holding frame, the catching arms embracing the fan therebetween.

6. The assembly of claim 5, wherein each of the catching arms forms a catch, the catches catching the fan.

7. The assembly of claim 6, wherein a pair of vertical protrusions is formed outwardly from opposite sides of the fan respectively, and wherein a pair of locating portions is formed on the baseplate of the holding frame, the locating portions being engaged with the protrusions for positioning the fan on the holding frame.

8. The assembly of claim 7, wherein each of the protrusions defines a vertical through hole therein, each of the locating portions comprises a pin, and the pins extend through the through holes respectively.

9. The assembly of claim 7, wherein the fan comprises a top wall and a peripheral wall extending downwardly from the top wall, the catches catch the top wall of the fan, and the protrusions are formed from the peripheral wall.

10. The assembly of claim 1, wherein a pair of blocking flanges extends from free edges of the supports respectively, for preventing displacement of the clips from the supports.

11. The assembly of claim 1, wherein each of the clips comprises a beam mounted on a corresponding support.

12. The assembly of claim 11, wherein a pair of clamping legs extends downwardly from the beam of each of the clips, four posts extend upwardly from the retention frame, and the clamping legs of the clips are engaged with the posts.

13. The assembly of claim 12, wherein each of the clamping leg forms a hook, each of the posts defines an aperture therein, the apertures engagingly receiving the hooks therein.

14. The assembly of claim 1, wherein an opening is defined in a middle of the holding frame, the opening communicating with the fan duct and the fan.

15. A heat dissipation assembly comprising:
    a retention frame;
    a heat sink mounted on the retention frame;
    a fan holder comprising a fan duct and a holding frame, the fan duct being mounted on the heat sink, one side of the holding frame being pivotally engaged with the fan duct, an opposite side of the holding frame being snappingly engaged with the fan duct;
    a fan held in the holding frame; and
    a pair of clips disposed on the fan duct and engaged with the retention frame.

16. The assembly of claim 15, wherein the fan comprises a pair of generally opposite protrusions having through holes defined therein respectively, and the holding frame comprises a pair of pins extending through the through holes of the fan respectively.

17. The assembly of claim 15, wherein three catching arms extend from the holding frame, the catching aims embracing the fan.

18. A heat sink assembly comprising:

a retention frame;

a heat sink located in the retention frame;

a fan holder mounted upon the heat sink, said fan holder including:

a fan duct assembled to the retention frame by at least one removable clip under a condition that a plate of the fan duct is sandwiched between the clip and the heat sink; and a holding frame pivotally releasably latched to the fan duct; wherein detachment between the clip and the retention frame and that between the fan duct and the and the holding frame do not interfere with each other.

* * * * *